United States Patent

Wiedmann

[15] 3,693,057

[45] Sept. 19, 1972

[54] MONOLITHIC CIRCUITS WITH PINCH RESISTORS

[72] Inventor: Siegfried K. Wiedmann, Poughkeepsie, N.Y.

[73] Assignee: International Business Machines Corporation, Armonk, N.Y.

[22] Filed: March 24, 1971

[21] Appl. No.: 127,751

Related U.S. Application Data

[63] Continuation of Ser. No. 801,387, Feb. 24, 1969, abandoned.

[30] Foreign Application Priority Data

March 1, 1968 Germany..........P 15 74 651.7

[52] U.S. Cl..........317/235 R, 317/235 D, 317/235 E, 307/279, 307/304

[51] Int. Cl...............................................H01l 19/00

[58] Field of Search...........317/235 D, 235 E, 235 Z; 307/238, 279, 213, 303

[56] References Cited

UNITED STATES PATENTS 3,510,735 5/1970 Potter........................317/235

3,573,754 4/1971 Merryman.................317/235

*Primary Examiner*—Jerry D. Craig

*Attorney*—Hanifin & Jancin and Robert J. Haase

[57] ABSTRACT

A monolithic power switching flip flop circuit comprising a pair of cross-coupled transistors, each having a "pinch" resistor formed in one common substrate. Each pinch resistor comprises a resistor and a diode connected to each other at one terminal, the second terminal of the resistor being connected to the base of a respective transistor and the other terminal of the diode being connected to the collector of said transistor through the bulk semiconductor material of the common substrate. By suitable external electrical connections, the resistor portion of each pinch resistor is connected in parallel with the diode portion of the other pinch resistor. Thus, each resistor is shunted by a diode and placed in the collector circuit of a respective transistor to form the electrical circuit equivalent of a conventional power switching flip flop utilizing minimum bulk semiconductor material.

4 Claims, 6 Drawing Figures

INVENTOR
SIEGFRIED K. WIEDMANN
BY Robert J. Haase
ATTORNEY

MONOLITHIC CIRCUITS WITH PINCH RESISTORS

CROSS-REFERENCE TO RELATED APPLICATION

This is a continuation of U.S. application Ser. No. 801,387 of Siegfried K. Wiedmann, filed Feb. 24, 1969, now abandoned.

BACKGROUND OF THE INVENTION

The invention relates to a monolithic electric circuit, preferably a memory cell such as a power switching flip flop, characterized by having a relatively large valued resistor and a diode electrically connected in parallel in the collector circuit of each transistor comprising the flip flop.

During reading or writing, monolithic memory flip flops frequently encounter increased power dissipation over the standby (memory) state of the flip flop. The relatively high power dissipation occuring temporarily and locally in the addressed memory flip flop must be dissipated over the monolithic substrate material in the form of heat. If the same dissipation were developed continuously, the memory would be rendered unservicable due to overheating. On the other hand, the use of cooling fins and the like is objectionable because it is incompatible with microminiaturization.

In an effort to minimize the power dissipation problem, provision has been made in the prior art for operating power switching flip flop transistors at low current levels during the storage mode and a relatively high current levels during brief operational (reading or writing) modes. This is usually accomplished by the inclusion of diode gating means in the collector circuit of the transistors by bypassing the relatively high operational current around the collector resistors during reading and writing. Special care must be taken, however, so that minimum amounts of semiconductor substrate material are allocated for the additional circuit elements in order that high component density (number of flip flops per unit area of substrate) be maintained. Copending patent application Ser. No. 763,870, filed Sept. 30, 1968, now U.S. Pat. No. 3,505,573 in the name of the present inventor and assigned to the present assignee discloses one monolithic circuit design for conserving the amount of semiconductor substrate material utilized in a power switching flip flop memory cell. The present invention is a further improvement in that the required monolithic substrate material is further reduced through the use of "pinch" resistors and the exploitation of the constituent resistances and rectifying P-N junctions thereof.

SUMMARY OF THE INVENTION

The invention is a monolithic flip flop memory cell comprising a pair of double emitter transistors and a pair of pinch resistors formed in the same monolithic structure. External metallization is provided for cross-coupling the transistors and for the application of biasing, addressing, reading and writing excitations. The circuit layout is formed in two symmetrical halves each surrounded by an isolation diffusion. Each symmetrical half comprises a pinch resistor and a double emitter transistor. The pinch resistor is formed in an elongation of the transistor base region and provides a resistor and a diode connected to each other at one terminal. The other terminal of the diode and the other terminal of the resistor are connected respectively, to the collector and the base of the transistor through the bulk semiconductor material of the substrate. External metallization electrically places the resistor in the collector circuit of the transistor formed in the other isolated half of the monolithic structure. Thus, in the composite circuit device, a resistor and a shunting diode are placed in the collector circuit of each transistor. The resistances of each resistor is sufficiently high to permit only a small collector current to flow to maintain the desired binary state in the respective flip flop transistor. The shunting diode is cut off during the quiescent memory mode of the flip flop. When the flip flop is addressed, however, for writing or reading purposes, the diode is rendered conductive by the application of a forward biasing pulse to bypass the higher operational current around the respective collective resistor to minimize heat dissipation. The use of the pinch resistor in the described manner significantly reduces the bulk semiconductor material required for the monolithic flip flop device whereby high device density is preserved without suffering undue power dissipation problems.

DESCRIPTION OF THE PREFERRED EMBODIMENT

Figure 1:
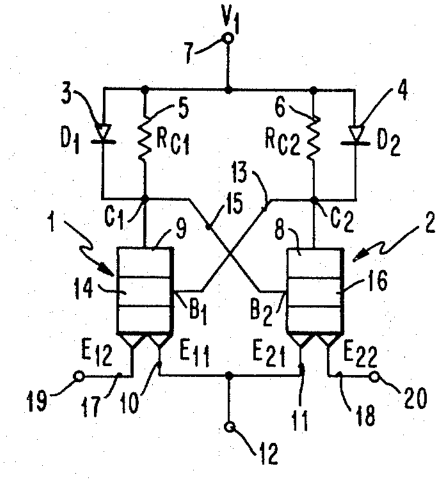
PRIOR ART FIG. 1
FIG. 1 is a simplified schematic sketch of a prior art monolithic flip flop memory cell using double emitter transistors.

The prior art power switching memory cell of FIG. 1 comprises a pair of dual emitter transistors 1 and 2, diodes 3 and 4 and resistors 5 and 6. One terminal of the diodes and resistors is connected to terminal 7. The other terminals of resistor 6 and diode 4 are connected to the collector 8 of transistor 2. The other terminals of resistor 5 and diode 3 are connected to collector 9 of transistor 1. Emitter 10 of transistor 1 and emitter 11 of transistor 2 are connected to terminal 12. Collector 8 of transistor 2 is connected by lead 13 to base 14 of transistor 1. Similarly, collector 9 of transistor 1 is connected by lead 15 to base 16 of transistor 2.

As described in the aforementioned copending patent application Ser. No. 763,870, one transistor, for example transistor 1 is quiescently conducting while the other transistor 2 is blocked. In the quiescent (memory) state, current flows through the conductive transistor 1 through emitter 10 which is held at a potential of 0 volts by a source (not shown) coupled to terminal 12. Emitters 17 and 18 are maintained at a small voltage above zero. During the same quiescent mode, terminal 7 is maintained at a potential sufficiently high to maintain a small current flowing through transistor 1 to preserve the binary data stored in said transistor.

When the memory cell of FIG. 1 is selected for writing or reading purposes, an address pulse is applied to terminal 12 having a magnitude sufficient to block conduction through emitters 10 or 11 (in this case 10). Upon the blocking of the conductive path through emitter 10, transistor 1 commences conduction through emitter 17. The conduction of emitter 17 is interpreted or read as the presence of a binary "1" in the memory cell. Inasmuch as transistor 2 is not in a state of conduction, the absence of conduction through emitter 18 also may be interpreted as a binary "1" in the memory cell.

Binary data may be written into the memory cell via terminals 19 and 20 upon the concurrent application of an address pulse to terminal 12. For example, if the conduction of transistor 1 is to be transferred to transistor 2 to store a binary "0" in the memory cell, a pulse is applied to terminal 19 having a magnitude comparable to that of the address pulse applied via terminal 12. The writing pulse applied to terminal 19 blocks conduction through emitter 17 whereas conduction through emitter 10 is blocked by the address pulse applied to terminal 12. The simultaneous blocking of emitters 10 and 17 shifts conduction to emitter 18 of transistor 2 by virtue of the cross-coupling acting between transistors 1 and 2. Upon the termination of the address pulse at terminal 12, conduction is shifted from emitter 18 to emitter 11 of transistor 2 to complete the storage cycle.

The significant feature of the prior art circuit of FIG. 1 is that diodes 3 and 4 remain blocked during the quiescent or memory mode of the flip flop allowing only a small current to flow through the collector resistor of the conducting transistor sufficient to preserve the stored binary state while producing minimum power dissipation. Upon addressing the memory cell, however, a positive voltage pulse is applied to terminal 7 concurrently with a positive address pulse to terminal 12 rendering conductive the diode across the collector resistor of the conducting transistor to bypass the heavier current required for writing or reading and thereby minimizing heat generation.

Figure 2:
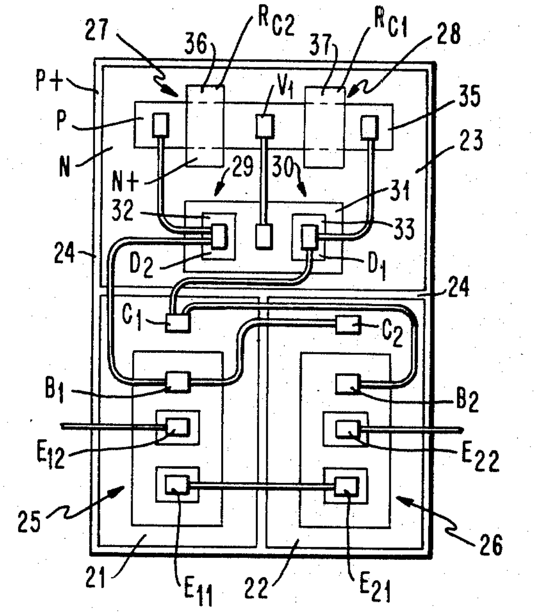
FIG. 2 is a simplified plan view of a straightforward instrumentation of the equivalent circuit of FIG. 1 using pinch resistors.

It is a well known fact that pinch resistors, in addition to requiring but little space on a monolithic device, have high layer resistance. Thus, one skilled in the art might consider the use of pinch resistors in a circuit designed for maximum component density. FIG. 2 represents what is considered to be a likely design layout of the power switching memory flip flop represented by FIG. 1 utilizing pinch resistors. The memory cell of FIG. 2 includes three islands 21, 22 and 23 of N material which are electrically isolated from one another by means of P+ diffusions 24. Islands 21 and 22 accommodate double emitter transistors 25 and 26, respectively. The third island 23 includes pinch resistors 27 and 28 and power switching diodes 29 and 30. Island 21 comprises epitaxial N material on which collector contact $C_1$ is placed and in which a P conductivity type base diffusion is made. Contact $B_1$ is placed on the base area. The base area, in turn, surrounds the two emitters $E_{11}$ and $E_{12}$. As in the case of island 21, island 22 comprises collector contact $C_2$, base contact $B_2$, and the emitter contacts $E_{21}$ and $E_{22}$.

The third island 23 likewise is made of epitaxial N material in which is made P diffusion 31. Two N+ diffusions 32 and 33 are made in P area 31. The PN junction between the P and the two N+ regions serves as diodes $D_1$ and $D_2$. P diffusion 35 is limited in depth in two places by N+ diffusions 36 and 37 to form two conventional pinch resistors. The semiconductor devices of FIG. 2 are interconnected by means of metallization in accordance with the connections represented in FIG. 1. Each component in the straightforward layout of FIG. 2 corresponds to a respective element of FIG. 1. However, in order to maximize component density it is advantageous where possible to supply more than one circuit element of FIG. 1 from a given component shown in FIG. 2. This is achieved in accordance with the present invention by deriving from each pinch resistor not only a relatively high resistance element but a diode as well.

Figure 3:
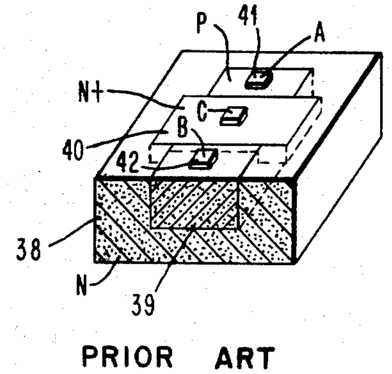
PRIOR ART FIG. 3
FIG. 3 is a perspective view, partly in cross-section, of a prior art pinch resistor.
Figure 3A:
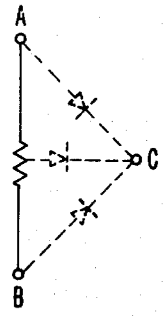
FIG. 3A is a simplified schematic diagram of the equivalent circuit of FIG. 3.

FIG. 3 shows a perspective view in cross-section of a pinch resistor whose equivalent circuit is represented by FIG. 3A. Collector material 38 accommodates base diffusion 39 which, in turn, is partly covered by emitter diffusion 40. The constricted thickness of the base layer 39 underneath the emitter diffusion 40 results in a relatively high resistance being exhibited between contacts 41 and 42. PN junctions exist between collector layer 38 and base layer 39 and between base layer 39 and emitter layer 40. Previously, such junction diodes were viewed as undesirable and were backbiased to minimize the effect of their presence. The present invention, on the contrary, utilizes these parasitic diodes to advantage. In the embodiment of the present invention depicted in FIG. 4, a pair of pinch resistors is included, each providing a resistor and a diode represented in the equivalent circuit of FIG. 1. The space savings accomplished thereby permits the realization of increased component density as may be seen upon a comparison of FIGS. 2 and 4.

Figure 4:
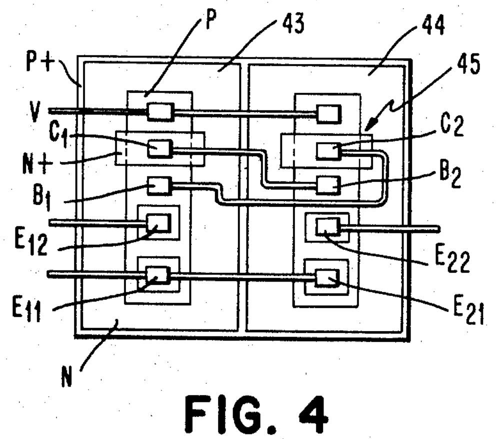
FIG. 4 is a simplified plan view of an embodiment of the present invention electrically similar to the circuit of FIG. 1.
Figure 4A:
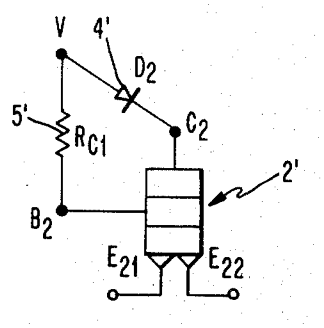
FIG. 4A is a simplified schematic diagram equivalent to a symmetrical half of the device of FIG. 4.

Referring to FIG. 4, each of the insulated islands 43 and 44 includes the circuit components represented in he equivalent circuit diagram of FIG. 4A. It should be particularly noted that each pinch resistor provides a diode and a resistor which are connected to each other at one end, the other terminal of the diode being connected through the substrate material to the collector of a respective transistor while the other terminal of the resistor is connected through the substrate material to the base thereof. For example, pinch resistor 45 of FIG. 4 yields diode 4′ and resistor 5′ of FIG. 4A corresponding, respectively, to diode 4 and resistor 5 of FIG. 1. Transistor 2′ of FIG. 4A corresponds to transistor 2 of FIG. 1. Diode 4′ of FIG. 4A is formed by the vertical structure of the semiconductor device of FIG. 4 and FIG. 3 between the N collector areas 38 and the P base layer 39. Diode 4′ is connected between terminal V and collector $C_2$ through the bulk semiconductor material and necessitates no external connections to the remaining circuit elements. An important advantage of the arrangement of FIG. 4 relative to that of FIG. 2 is that the former requires less space due to the elimination of the third isolated island 23 of FIG. 2 along with its separate diodes 29 and 30 and the barrier layer 24. Another beneficial feature of the layout of FIG. 4 over that of FIG. 2 is the elimination of certain metalliztions between the collector resistors and the diodes, between the diodes and the collectors, and between the collector resistors and the bases as shown in FIG. 4A. This leads to increased reliability.

While the invention has been particularly shown and described with reference to preferred embodiments thereof, it will be understood by those skilled in the art that various changes in form and details may be made therein without departing from the spirit and scope of the invention.

What is claimed is:

1. A flip flop comprising:

two electrically isolated regions on a monolithic semiconductor substrate characterized in that there is formed in each of said isolated regions a transistor having emitter, base and collector, said base having an elongated region, said elongated region forming a resistor and a diode connected to each other at a first terminal, the second terminal of said resistor being connected to the base of said transistor and the second terminal of said diode being connected to the collector of said transistor, and electrical connections for coupling the resistor formed by one elongated region in parallel with the diode formed by the other elongated region, said connections comprising a first connection between said first terminal of said resistors, a second connection between the base of one transistor and the collector of the other transistor, and a third connection between the base of said other transistor and the collector of said one transistor.

2. A flip flop comprising:

two electrically isolated regions on a monolithic semiconductor substrate characterized in that there is formed in each of said isolated regions a transistor and a pinch resistor, said transistor having emitter, base and collector, said pinch resistor comprising an elongation of the base region of said transistor and a doped region of opposite conductivity type to that of said base region, said doped region being shallower than said base region and extending across and beyond said elongation whereby said pinch resistor forms a resistor and a diode connected to each other at a first terminal, the second terminal of said resistor being connected to the base of said transistor and the second terminal of said diode being connected to the collector of said transistor, and electrical connections for coupling the resistor formed by one pinch resistor in parallel with the diode formed by the other pinch resistor, said connections comprising a first connection between said first terminals of said resistors, a second connection between the base of one transistor and the collector of the other transistor, and a third connection between the base of said other transistor and the collector of said one transistor.

3. The flip flop defined in claim 2 wherein each of said second and third connections includes and ohmic contact on said doped region.

4. A flip flop memory cell comprising:

two electrically isolated regions on a monolithic semiconductor substrate characterized in that there is formed in each of said isolated regions a transistor and a pinch resistor, said transistor having emitter, base and collector, said pinch resistor comprising an elongation of the base region of said transistor and an emitter diffusion extending across and beyond said elongation, whereby said pinch resistor forms a resistor and a diode connected to each other at a first terminal, the second terminal of said resistor being connected to the base of said transistor and the second terminal of said diode being connected to the collector of said transistor, and electrical connections for coupling the resistor formed by one pinch resistor in parallel with the diode formed by the other pinch resistor, said connections comprising a first connection between said first terminals of said resistors, a second connection between the base of one transistor and the collector of the other transistor, and a third connection between the base of said other transistor and the collector of said one transistor.

* * * * *